(12) United States Patent
Fujimoto et al.

(10) Patent No.: US 7,776,196 B2
(45) Date of Patent: Aug. 17, 2010

(54) METHOD FOR ARRANGING PARTICLES AND METHOD FOR MANUFACTURING LIGHT-EMITTING DEVICE

(75) Inventors: Akira Fujimoto, Kawasaki (JP); Tsutomu Nakanishi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 585 days.

(21) Appl. No.: 11/687,709

(22) Filed: Mar. 19, 2007

(65) Prior Publication Data

US 2008/0078678 A1  Apr. 3, 2008

(30) Foreign Application Priority Data

Sep. 28, 2006  (JP) .............................. 2006-265428

(51) Int. Cl.
*C25D 5/00* (2006.01)
*B01D 57/02* (2006.01)
*B05D 5/06* (2006.01)
*B05D 3/00* (2006.01)
*B05D 3/06* (2006.01)
*B05D 1/04* (2006.01)
*C23C 18/00* (2006.01)
*C23C 18/14* (2006.01)
*C23C 20/00* (2006.01)
*C23C 14/30* (2006.01)
*H05B 7/00* (2006.01)

(52) U.S. Cl. .................. 205/92; 204/450; 427/458; 427/466; 427/472; 427/473; 427/474; 427/535; 427/554; 427/555; 427/556; 427/66; 427/551; 427/581; 427/596

(58) Field of Classification Search .................. 205/92; 204/450; 427/66, 551, 554, 555, 581, 596
See application file for complete search history.

(56) References Cited

U.S. PATENT DOCUMENTS

| | | | | |
|---|---|---|---|---|
| 2001/0045362 A1* | 11/2001 | Deng et al. | .................. | 205/120 |
| 2002/0127563 A1* | 9/2002 | Salafsky | ........................ | 435/6 |
| 2003/0222048 A1* | 12/2003 | Asakawa et al. | ................ | 216/2 |
| 2005/0053974 A1* | 3/2005 | Lakowicz et al. | .............. | 435/6 |
| 2005/0122550 A1* | 6/2005 | Plewa et al. | .................... | 359/10 |

FOREIGN PATENT DOCUMENTS

JP  2001149774 A  *  6/2001

OTHER PUBLICATIONS

Machine translation of Yamada et al. JP 2001149774 A.*
Dholakia et al. "Creation and Manipulation of Three-Dimensional Optically Trapped Structures" Science, vol. 296, May 10, 2002, pp. 1101-1103.*

(Continued)

*Primary Examiner*—Nam X Nguyen
*Assistant Examiner*—Susan Thai
(74) *Attorney, Agent, or Firm*—Turocy & Watson, LLP

(57) ABSTRACT

A method for arranging particles according to one aspect of the present invention comprises the steps of: forming a thin film on a surface of a substrate, the thin film being obtained by dispersing first particles made of metal in a material, a surface of the material is to be charged to a first polarity in a predetermined solution; dispersing second particles in the solution, the second particles being charged to a second polarity opposite to the first polarity; immersing the thin film in the solution; and irradiating the thin film with light having a wavelength which causes plasmon resonance with surface plasmons of the metal particles.

13 Claims, 8 Drawing Sheets

OTHER PUBLICATIONS

Gruttner et al. "Improved properties of magnetic particles by combination of different polymer materials as particle matrix" Journal of Magnetism and Magnetic Materials 225 (2001) 1-7.*

Fukuda et al, Self-Organizing Three-Dimensional Colloidal Photonic Crystal Structure with Augmented Dielectric Contrast, Japanese Journal of Applied Physics, 1998, vol. 37, pp. 508-511.

Holgado et al, Electrophoretic Deposition to Control Artificial Opal Growth, Langmuir, 1999, vol. 15, pp. 4701-4704.

Dimitrov et al, Continuous Convective Assembling of Fine Particles into Two-Dimensional Arrays on Solid Surfaces, Langmuir, 1996, vol. 12, pp. 1303-1311.

Joannopoulos, Self-Assembly Lights Up, vol. 441, pp. 257-258.

Jiang et al, Large-Scale Fabrication of Wafer-Size Colloidal Crystals, Macroporous Polymers and Nanocomposites by Spin-Coating, JACS Articles, vol. 126, 2004, pp. 13778-13786.

* cited by examiner

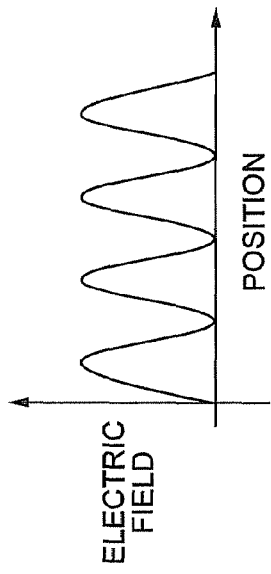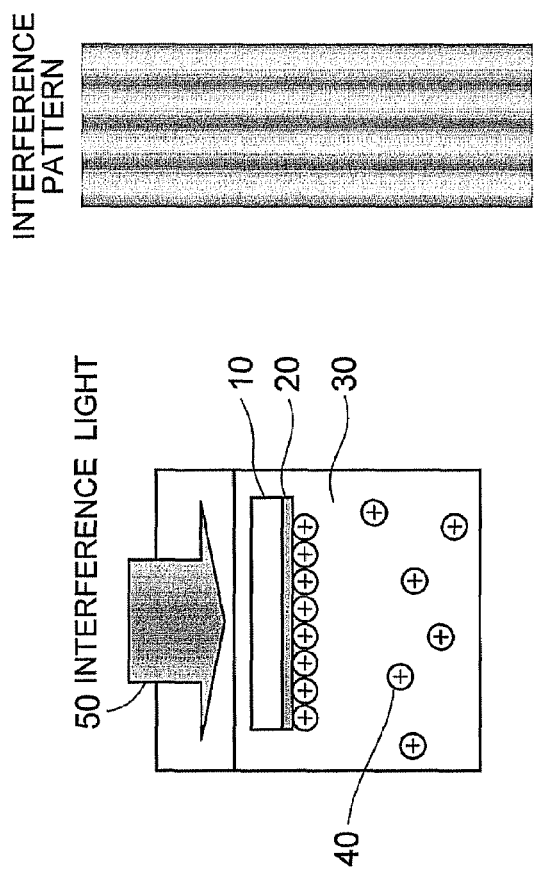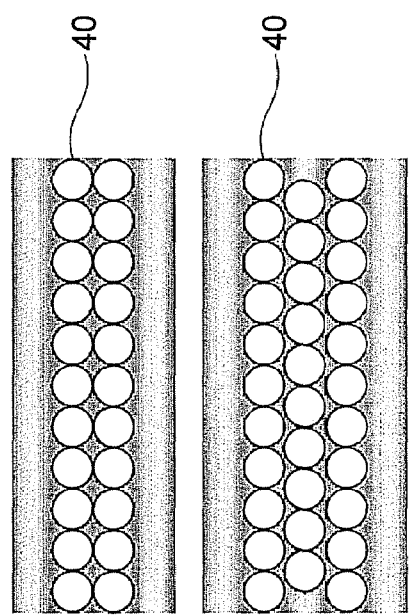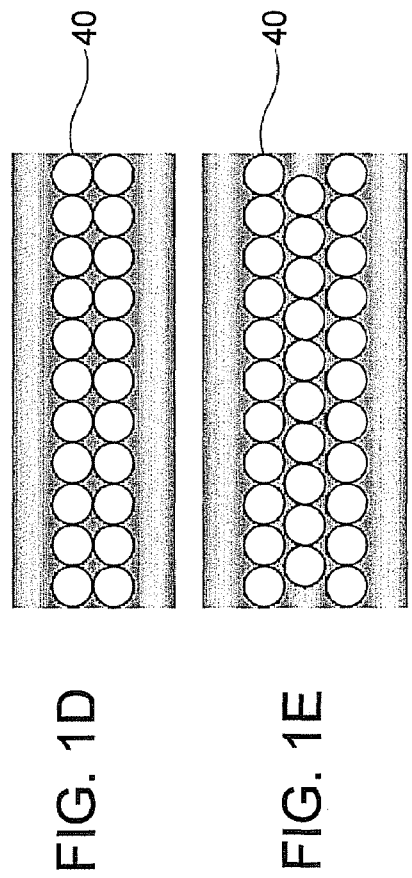
FIG. 1A
FIG. 1B
FIG. 1C
FIG. 1D
FIG. 1E

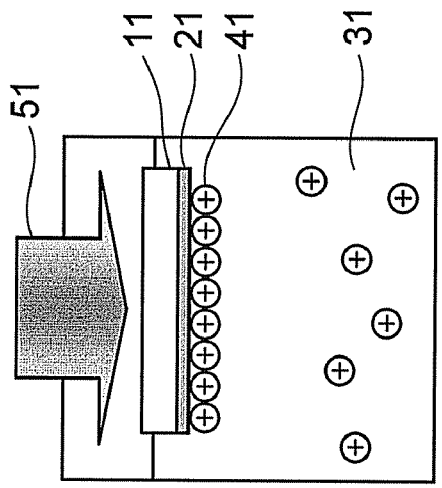
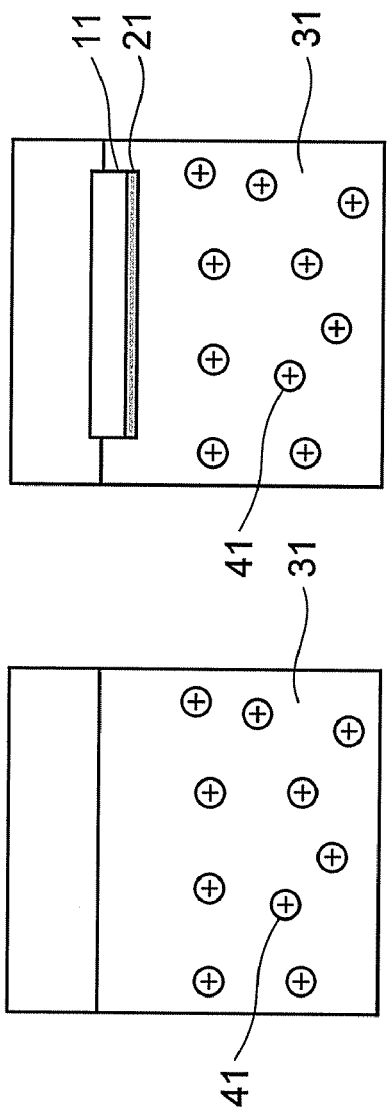
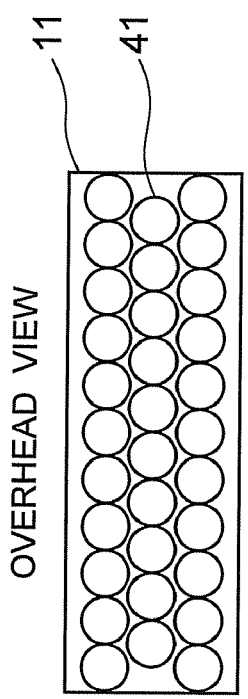

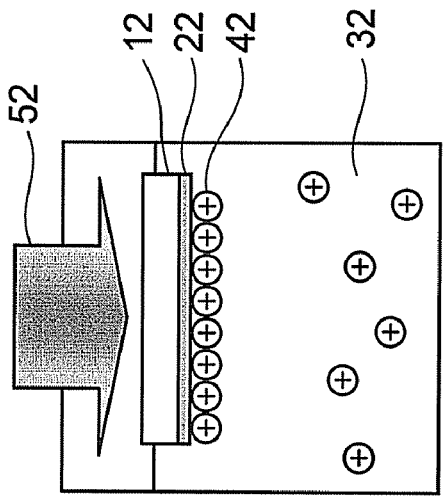
FIG. 3C
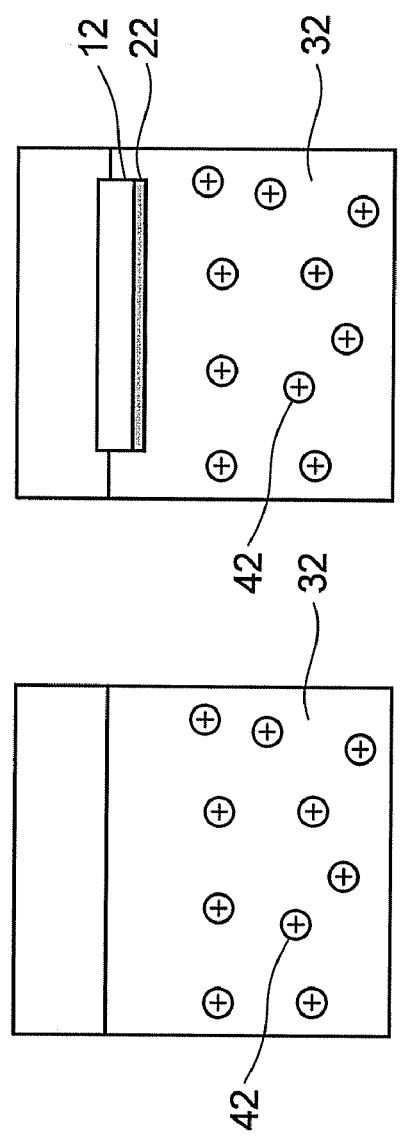
FIG. 3B
FIG. 3A
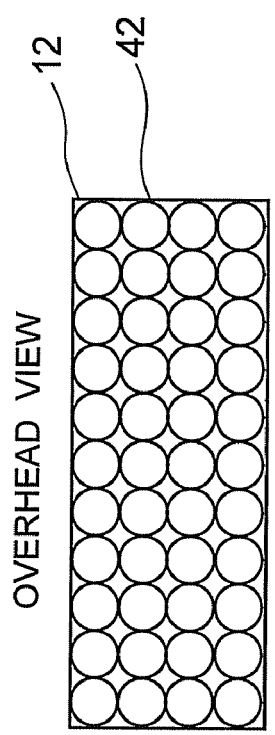
FIG. 3D

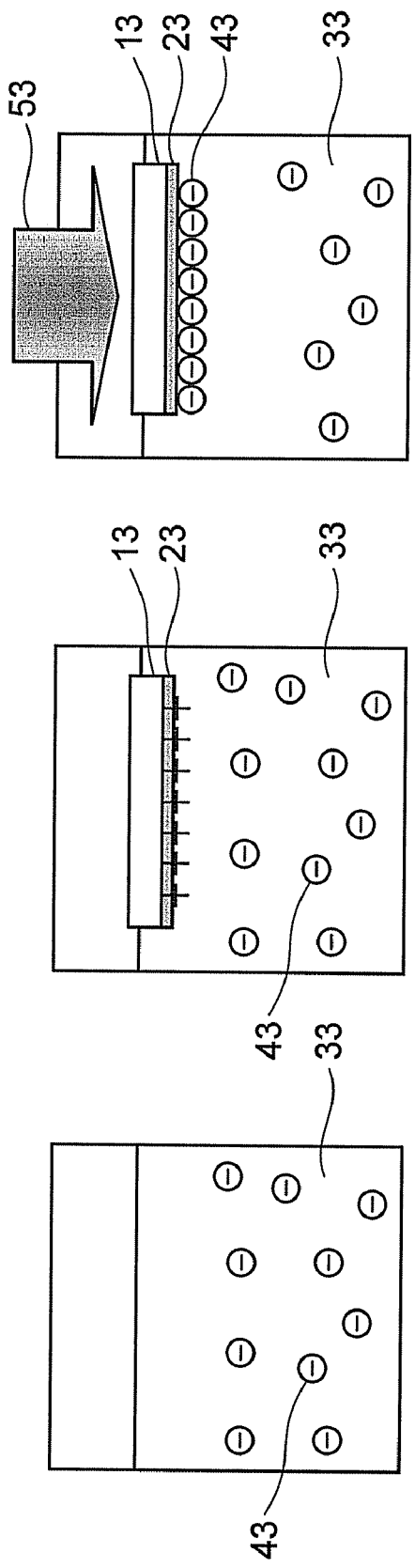

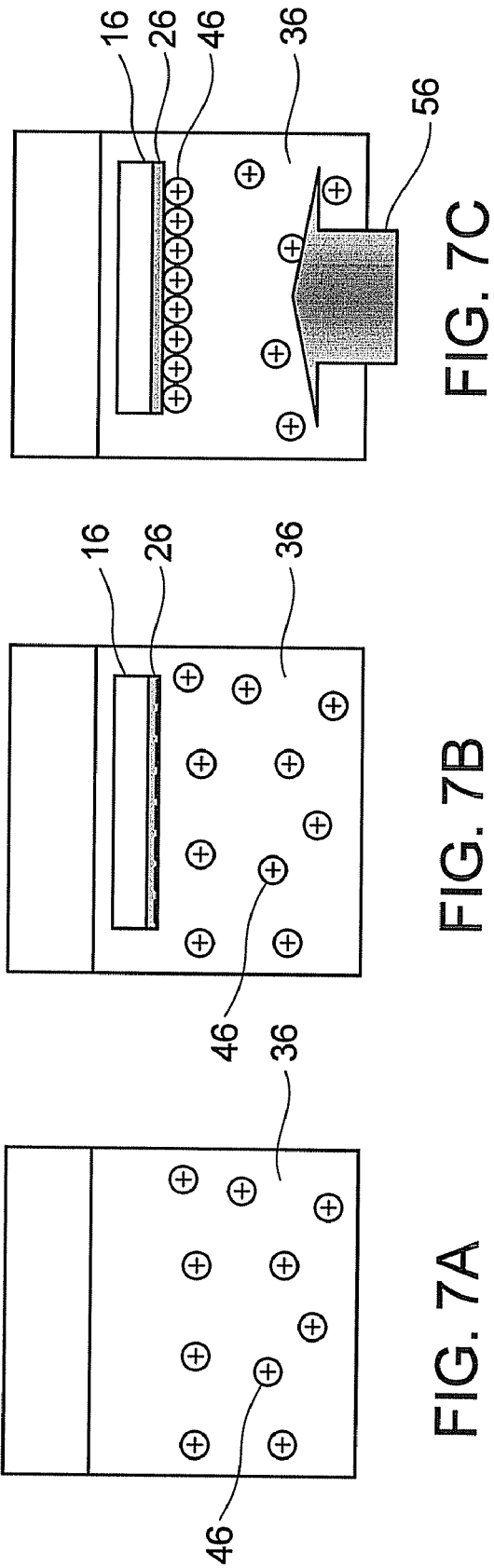

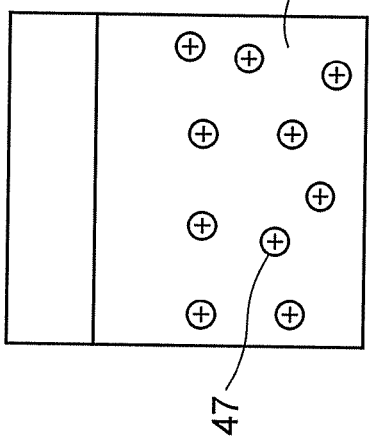
FIG. 8A
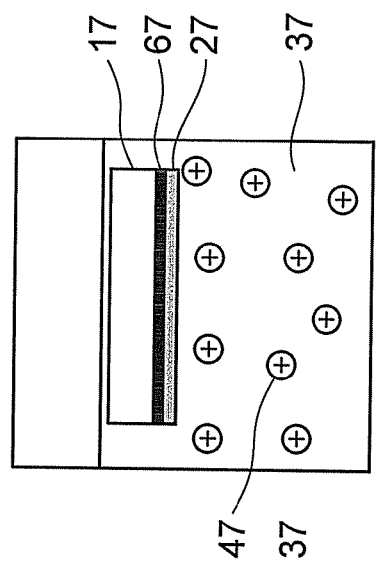
FIG. 8B
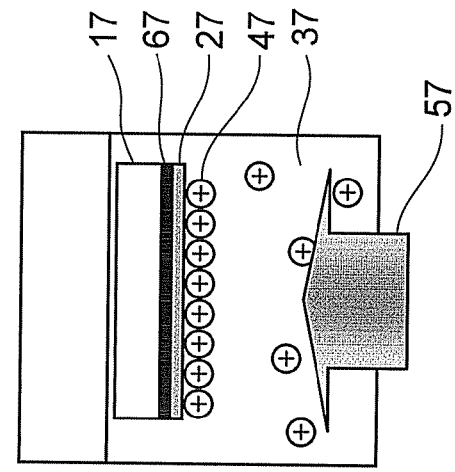
FIG. 8C
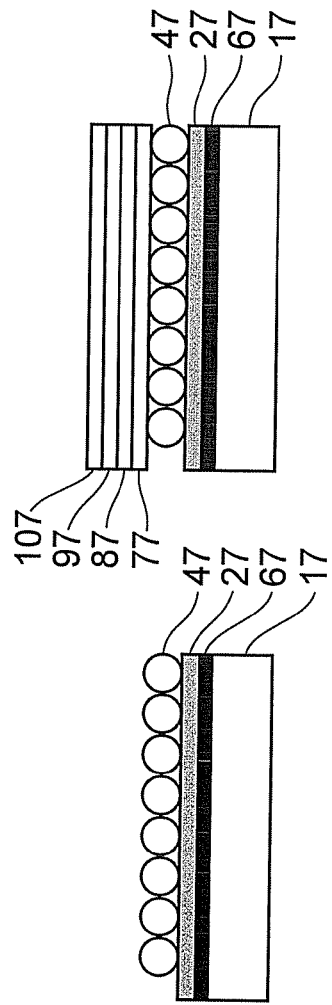
FIG. 8D
FIG. 8E

METHOD FOR ARRANGING PARTICLES AND METHOD FOR MANUFACTURING LIGHT-EMITTING DEVICE

CROSS-REFERENCE TO RELATED APPLICATION

This application is based upon and claims the benefit of priority from prior Japanese Patent Application No. 2006-265428 filed on Sep. 28, 2006; the entire contents of which are incorporated herein by reference.

BACKGROUND OF THE INVENTION

1. Field of the Invention

The present invention relates to a method for arranging particles. The present invention also relates to a method for manufacturing a light-emitting device by using the method for arranging particles.

2. Related Background Art

As techniques for arranging particles having a diameter of about 100 nm to several micrometers on the surface of a substrate, there are known methods utilizing sedimentation, electric field, capillary force, meniscus force, shearing stress, or the like.

For a method for arranging particles by utilizing sedimentation, see, for example, K. Fukuda et al. "Self-Organizing Three-Dimensional Colloidal Photonic Crystal Structure with Augmented Dielectric Contrast": Japanese Journal of Applied Physics, Vol. 37, p. 508-p. 511, 1998.

For a method for arranging particles by utilizing an electric field, see, for example, M. Holgano et al. "Electrophoretic Deposition To Control Artificial Opal": Langmuir, Vol. 15, p. 4701-p. 4704, 1999.

For a method for arranging particles by utilizing capillary force, see, for example, Antony S. Dimitrov et al. "Continuous Convective Assembling of Fine Particles into Two-Dimensional Arrays on Solid Surfaces": Langmuir, Vol. 12, p. 1303-p. 1311, 1996.

For a method for arranging particles by utilizing meniscus force, see, for example, J. D. Joannopoulos "Self-assembly lights up": Nature, Vol. 414, p. 257-p. 258, 2001.

For a method for arranging particles by utilizing shearing stress, see, for example, P. Jiang et al. "Large-Scale Fabrication of Wafer-Size Colloidal Crystals, Macroporous Polymers and Nanocomposites by Spin-Coating": Journal of the American Chemical Society, Vol. 126, p. 13778-p. 13786, 2004.

However, none of these methods mentioned above are ideal as methods for arranging particles because there are cases where some particles are irregularly arranged or particles are not arranged in a perfect monolayer.

Therefore, there is demand for development of a method for arranging particles, which is capable of regularly arranging particles in a monolayer. Such a method for arranging particles can be applied to a method for manufacturing a light-emitting device.

SUMMARY OF THE INVENTION

According to one aspect of the present invention, there is provided a method for arranging particles comprising the steps of: forming a thin film on a surface of a substrate, the thin film being obtained by dispersing first particles made of metal in a material, a surface of the material is to be charged to a first polarity in a predetermined solution; dispersing second particles in the solution, the second particles being charged to a second polarity opposite to the first polarity; immersing the thin film in the solution; and irradiating the thin film with light having a wavelength which causes plasmon resonance with surface plasmons of the metal particles.

According to another aspect of the present invention, there is provided a method for manufacturing a light-emitting device comprising the steps of: forming a metal film on a surface of a substrate; forming a thin film on the metal film, the thin film being obtained by dispersing first particles made of metal in a material, a surface of the material is to be charged to a first polarity in a predetermined solution; dispersing second particles in the solution, the second particles being charged to a second polarity opposite to the first polarity; immersing the thin film in the solution; irradiating the thin film with light having a wavelength which causes plasmon resonance with surface plasmons of the metal particles; drying the thin film and the substrate; and forming a laminate structure on a monolayer of the second particles formed on the thin film, the laminate structure including a transparent cathode electrode, an organic light-emitting layer and a transparent anode electrode.

BRIEF DESCRIPTION OF THE DRAWINGS

FIGS. 1A to 1E are schematic diagrams for explaining the outline and principles of each embodiment of the present invention;

FIGS. 2A to 2D are schematic diagrams for explaining the outline of a first embodiment of the present invention;

FIGS. 3A to 3D are schematic diagrams for explaining the outline of a second embodiment of the present invention;

FIGS. 4A to 4D are schematic diagrams for explaining the outline of a third embodiment of the present invention;

FIGS. 7A to 7D are schematic diagrams for explaining the outline of a sixth embodiment of the present invention; and FIGS. 8A to 8E are schematic diagrams for explaining the outline of a seventh embodiment of the present invention.

DETAILED DESCRIPTION OF THE EMBODIMENTS

Figure 5C:
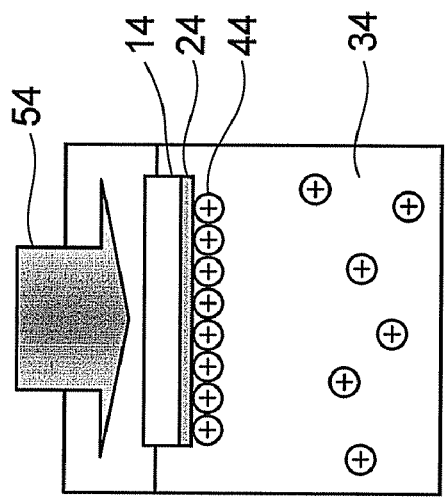
FIGS. 5A to 5D are schematic diagrams for explaining the outline of a fourth embodiment of the present invention.

In each embodiment of a method for arranging particles according to the present invention, a thin film, in which metal (e.g., gold or silver) nano-particles (metal fine particles) having a diameter of several nanometers are dispersed, is formed on the surface of a transparent substrate, and the surface of such a thin film is to be negatively (or positively) charged in a predetermined solution.

On the other hand, particles intended to be regularly arranged in a monolayer have a diameter of 100 nm to several micrometers, and these particles are positively (or negatively) charged and dispersed in the predetermined solution mentioned above.

These particles are not strongly electrically-charged by simply dispersing them in the solution, and therefore are not attached to the surface of the thin film formed on the transparent substrate unless they are made to sediment.

However, when the thin film is irradiated with light having a specific wavelength from the back or front side of the transparent substrate, resonance occurs between the light and surface plasmons of the metal fine particles, thereby greatly enhancing an electric field in the vicinity of the surface of the thin film in accordance with a light irradiation pattern.

The light, with which the thin film is irradiated, may be patterned light having an irradiation pattern corresponding to an intended particle arrangement pattern. For example, an interference pattern of laser light can be used as such pattern light.

When resonance occurs between interference light and surface plasmons, an electric field in the vicinity of the surface of the thin film is enhanced ten times or more, and as a result, the particles are attached to the surface of the thin film overlapping with a bright area of the interference pattern of the interference light. As described above, since the particles are attached to the surface of the thin film in accordance with the interference pattern of the interference light, they are regularly arranged.

The range of an electric field to be enhanced by resonance is limited to within a distance of about several nanometers or a distance of about a wavelength of the interference light at most from the surface of the thin film, and therefore only a monolayer of the particles is attached to the surface of the thin film.

Therefore, according to the features of each embodiment of the method for arranging particles of the present invention, it is possible to regularly arrange the particles in a monolayer on the transparent substrate.

Hereinbelow, a description will be made with reference to principles used in each embodiment of the method for arranging particles according to the present invention, that is, with reference to resonance between light and surface plasmons of the metal fine particles, which makes it possible to regularly arrange the particles in a monolayer with the help of an enhanced electric field in the vicinity of the surface of the thin film formed on the transparent substrate.

First, in order to facilitate the understanding of resonance between surface plasmons of the metal fine particles and light, a description will be made with reference to a case where light is incident on a flat metal surface.

Surface plasmon refers to a phenomenon in which free electrons in a metal oscillate collectively in the vicinity of the surface of a metal fine particle. In the case of normal incidence of light on a flat metal surface, resonance does not occur between the light and surface plasmons.

As a method for causing resonance between surface plasmons and light, that is, as a method for optically exciting surface plasmons, an attenuated total reflection (ATR) method using a prism is often employed.

In such an attenuated total reflection method, a thin film of gold or silver, having a thickness of several tens of nanometers, is attached to the bottom surface of a prism, and laser light is made to enter the prism while the incident angle of the laser light is varied. At the same time, the intensity of reflected light of the laser light is monitored, which results in a drop in reflected light intensity at a certain angle of a total reflection angle or more. That is, at the time when the laser light enters the prism at that angle, resonance between light and surface plasmons, that is, surface plasmon resonance occurs. An angle at which such resonance occurs can be determined from the following equation (1):

$$n_1 \times (2\pi/\lambda) \times \sin \theta_1 = (2\pi/\lambda) \times (\epsilon_g \times \epsilon_m / (\epsilon_g + \epsilon_m))^{1/2} \quad (1)$$

where $n_1$ is a refractive index of glass, $\theta_1$ is an incident angle, $\epsilon_g$ is a dielectric constant of the glass, $\epsilon_m$ is a dielectric constant of metal, and $\lambda$ is a wavelength of incident light.

At an angle that can be determined from the above equation (1), surface plasmon resonance occurs, and the energy of an incident light is transferred to surface plasmons. The electric field distribution at this time is as follows: an electric field at a metal surface is enhanced but is exponentially attenuated with increasing distance from the metal surface. That is, the range of an electric field to be enhanced is limited to within a distance of about a wavelength of the incident light from the metal surface. In a case where the metal is silver, an electric field at a metal surface enhanced by resonance is 100 times greater than an electric field at the metal surface when resonance does not exist. In this way, an electric field in the vicinity of the metal surface is significantly enhanced by resonance between surface plasmons and light.

Next, a description will be made with reference to the surface plasmon resonance of a metal fine particle.

In the vicinity of the surface of a metal fine particle, surface plasmons are localized. In the case of such localized surface plasmons, there are eigenmodes called whispering gallery modes. Different eigenmodes of a metal sphere are assigned different mode numbers, and exist inside and outside thereof. It is known that the absolute value of an electric field in the vicinity of a surface outside of a metal sphere is attenuated in the direction of the radius of the metal sphere.

That is, surface plasmons are localized at the surface of a metal sphere, and therefore an electric field in the vicinity of the surface of a metal fine particle is significantly enhanced. When light having a specific wavelength that resonates with surface plasmons is incident on the surface of a metal fine particle, resonance occurs between the light and surface plasmons.

What is different here from the case of a flat metal surface described above is that it is not necessary to use, for example, a prism to allow light, which has a specific angle of a total reflection angle or more and usually cannot be incident on a metal surface, to be incident on a metal surface.

That is, in the case of a metal fine particle, it is possible to significantly enhance an electric field in the vicinity of the surface of the metal fine particle by allowing light, having a specific resonant wavelength, to be incident on the surface of the metal fine particle irrespective of the incident angle thereof. Therefore, by using metal fine particles, it is possible to easily enhance an electric field in the vicinity of the surface of the metal particles.

Examples of a metal fine particle that can cause resonance between light and surface plasmons include silver and gold fine particles having a diameter of 10 nm or less, for example, about several nanometers.

Accordingly, in each embodiment of the method for arranging particles according to the present invention, particles are arranged by utilizing such resonance between surface plasmons of metal fine particles and light.

FIGS. 1A to 1E are schematic diagrams for explaining the outline and principles of each embodiment of the method for arranging particles according to the present invention.

In each embodiment of the method for arranging particles according to the present invention, a thin film 20 obtained by dispersing metal nanoparticles (metal fine particles), such as gold or silver, with a diameter of several nanometers, in a material whose surface is to be negatively (or positively) charged in a predetermined solution 30, is formed on the surface of a transparent substrate 10.

Examples of the material of the thin film 20 to be electrically charged may include polymers which cannot be dissolved in a solvent of the solution 30 and which have an ionic modifying group as a terminal group. For example, carboxylic acid is negatively charged in the solution 30, and a polymer having an amino group as a terminal group is positively charged in the solution 30. Accordingly, a polymer having a terminal group whose polarity is opposite to that of particles 40 which are to be dispersed in the solution 30 and arranged on the thin film 20 may be selected as a material of the thin film 20.

The particles 40 to be arranged on the thin film 20 are positively (or negatively) charged and dispersed in the solution 30. It should be noted that no limitation is imposed on the time-series relationship between the step of forming the thin film 20 on the surface of the transparent substrate 10 and the step of dispersing the particles 40 in the solution 30.

Then, as shown in FIG. 1A, the transparent substrate 10 is immersed in the solution 30 in such a manner that at least the thin film 20 is immersed in the solution 30, and the thin film 20 is irradiated with interference light 50 having a specific wavelength from the back or front side of the transparent substrate 10.

In each embodiment of the method for arranging particles according to the present invention, the thin film 20 is irradiated with light which resonates with surface plasmons of the metal fine particles, such as, as shown in FIG. 1B, a striped interference pattern of laser light comprising a plurality of parallel laser lines. The interval of the interference pattern is made to be approximately equal to the particle size of the particles 40 to be arranged on the thin film 20.

When the thin film 20 is irradiated with the interference light 50 having the above-described interference pattern, resonance occurs between the interference light 50 and surface plasmons of the metal fine particles dispersed in the thin films 20, and as a result, as shown in FIG. 1C, an electric field in the vicinity of the surface of the thin film 20 is significantly enhanced in accordance with the interference pattern of the interference light 50. That is, an electric field at the surface of the thin film 20 corresponding to a bright area of the interference pattern of the laser light 50 is enhanced.

Then, as shown in FIGS. 1D and 1E, the particles 40 are attached to the surface of the thin film 20 overlapping with a bright area of the interference pattern of the interference light 50 so that the particles 40 are regularly arranged.

It should be noted that in a case where the interval of the interference pattern is substantially the same as the particle size of the particles 40, as shown in FIG. 1E, the particles 40 can be arranged in a triangular lattice, and in a case where the interval of the interference pattern is slightly larger than the particle size of the particles 40, as shown in FIG. 1D, the particles 40 can be arranged in a square lattice.

Further, as shown by the axis of ordinate in FIG. 1C, the range of an electric field to be enhanced is limited to within a distance of about several nanometers or a distance of about a wavelength of the interference light 50 at most from the surface of the thin film 20, and therefore only a monolayer of the particles 40 is attached to the surface of the thin film 20.

As described above, according to each embodiment of the method for arranging particles of the present invention, it is possible to regularly arrange the particles 40 in a monolayer on the transparent substrate 10.

Hereinbelow, the method for arranging particles according to the present invention will be described in detail with reference to more concrete embodiments shown in the accompanying drawings.

FIGS. 2A to 2D are schematic diagrams for explaining the outline of the method for arranging particles according to a first embodiment of the present invention.

As shown in FIG. 2A, in the first embodiment of the present invention, silica particles 41 having a diameter of 500 nm were dispersed in water, as a dispersion liquid 31, having a pH of 4 so that the concentration of the silica particles 41 was 1 wt %. In the dispersion liquid 31, the silica particles 41 were weakly positively charged.

On the surface of a glass substrate 11 used as a transparent substrate, a 100 nm thickness ionic polymer thin film 21 containing silver fine particles having a diameter of 5 nm was formed.

Then, as shown in FIG. 2B, only a surface of the glass substrate 11, on which the ionic polymer thin film 21 had been formed, was immersed in the dispersion liquid 31 without immersing the back surface of the glass substrate 11 in the dispersion liquid 31. At this time, the surface of the ionic polymer thin film 21 was negatively charged.

After only the surface of the glass substrate 11, on which the thin film 21 had been formed, was immersed in the dispersion liquid 31, as shown in FIG. 2C, the thin film 21 was irradiated with laser interference light 51 having a wavelength of 500 nm from the back side of the glass substrate 11 for 10 minutes. As a result, the silica particles 41 contained in the dispersion liquid 31 were attached to the surface of the thin film 21 in accordance with the interference pattern of the laser interference light 51.

Then, the glass substrate 11 was pulled up from the dispersion liquid 31 and dried. As a result, it was found that, as shown in FIG. 2D, the silica particles 41 were attached to an area irradiated with the laser interference light 51, and arranged in a triangular lattice to form a monolayer.

FIGS. 3A to 3D are schematic diagrams for explaining the outline of the method for arranging particles according to a second embodiment of the present invention.

As shown in FIG. 3A, in the second embodiment of the present invention, silica particles 42 having a diameter of 480 nm were dispersed in water, as a dispersion liquid 32, having a pH of 4 so that the concentration of the silica particles 42 was 1 wt %. In the dispersion liquid 32, the silica particles 42 were weakly positively charged.

On the surface of a glass substrate 12 used as a transparent substrate, a 100 nm thickness ionic polymer thin film 22 containing silver fine particles having a diameter of 5 nm was formed.

Then, as shown in FIG. 3B, only a surface of the glass substrate 12, on which the ionic polymer thin film 22 had been formed, was immersed in the dispersion liquid 32 without immersing the back surface of the glass substrate 12 in the dispersion liquid 32. At this time, the surface of the ionic polymer thin film 22 was negatively charged.

After only the surface of the glass substrate 12, on which the thin film 22 had been formed, was immersed in the dispersion liquid 32, as shown in FIG. 3C, the thin film 22 was irradiated with laser interference light 52 having a wavelength of 500 nm from the back side of the glass substrate 12 for 10 minutes. As a result, the silica particles 42 contained in the dispersion liquid 32 were attached to the surface of the thin film 22 in accordance with the interference pattern of the laser interference light 52.

Then, the glass substrate 12 was pulled up from the dispersion liquid 32 and dried. As a result, it was found that, as shown in FIG. 3D, the silica particles 42 were attached to an area irradiated with the laser interference light 52, and arranged in a square lattice to form a monolayer.

As described above, in the second embodiment of the present invention, since the diameter of the silica particles 42 was slightly smaller than the wavelength of the laser interference light 52, the silica particles 42 forming a monolayer were arranged in a square lattice.

FIGS. 4A to 4D are schematic diagrams for explaining the outline of the method for arranging particles according to a third embodiment of the present invention.

As shown in FIG. 4A, in the third embodiment of the present invention, silica particles 43 having a diameter of 500 nm were dispersed in water, as a dispersion liquid 33, having a pH of 10 so that the concentration of the silica particles 43 was 1 wt %. In the dispersion liquid 33, the silica particles 43 were weakly negatively charged.

On the surface of a glass substrate 13 used as a transparent substrate, a 100 nm thickness ionic polymer thin film 23 containing silver fine particles having a diameter of 5 nm was formed.

Then, as shown in FIG. 4B, only a surface of the glass substrate 13, on which the ionic polymer thin film 23 had been formed, was immersed in the dispersion liquid 33 without immersing the back surface of the glass substrate 13 in the dispersion liquid 33. At this time, the surface of the ionic polymer thin film 23 was positively charged.

After only the surface of the glass substrate 13, on which the thin film 23 had been formed, was immersed in the dispersion liquid 33, as shown in FIG. 4C, the thin film 23 was irradiated with laser interference light 53 having a wavelength of 500 nm from the back side of the glass substrate 13 for 10 minutes. As a result, the silica particles 43 contained in the dispersion liquid 33 were attached to the surface of the thin film 23 in accordance with the interference pattern of the laser interference light 53.

Then, the glass substrate 13 was pulled up from the dispersion liquid 33 and dried. As a result, it was found that, as shown in FIG. 4D, the silica particles 43 were attached to an area irradiated with the laser interference light 53, and arranged in a triangular lattice to form a monolayer.

As described above, in the third embodiment of the present invention, the electrically-charged silica particles 43 and ionic polymer thin film 23 were opposite in polarity to those of the first embodiment, but as in the case of the first embodiment, it was possible to arrange the silica particles 43 in a triangular lattice to form a monolayer.

FIGS. 5A to 5D are schematic diagrams for explaining the outline of the method for arranging particles according to a fourth embodiment of the present invention.

Figure 5B:
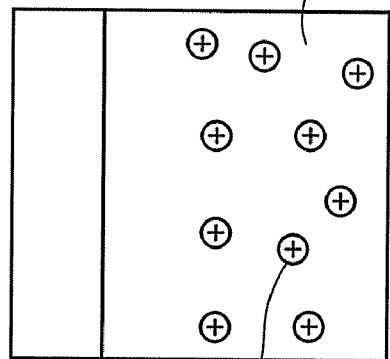
Figure 5A:
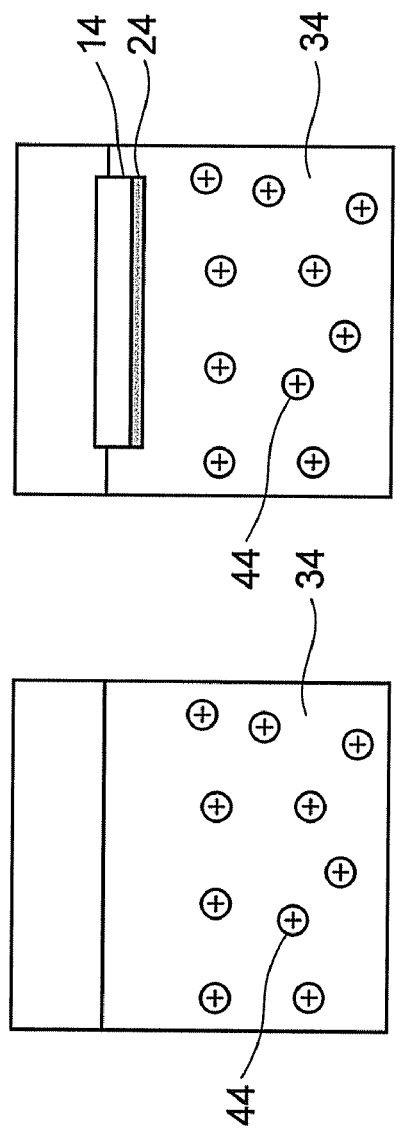

As shown in FIG. 5A, in the fourth embodiment of the present invention, silica particles 44 having a diameter of 500 nm were dispersed in water, as a dispersion liquid 34, having a pH of 4 so that the concentration of the silica particles 44 was 1 wt %. In the dispersion liquid 34, the silica particles 44 were weakly positively charged.

On the surface of a glass substrate 14 used as a transparent substrate, a 100 nm thickness ionic polymer thin film 24 containing gold fine particles having a diameter of 5 nm was formed.

Then, as shown in FIG. 5B, only a surface of the glass substrate 14, on which the ionic polymer thin film 24 had been formed, was immersed in the dispersion liquid 34 without immersing the back surface of the glass substrate 14 in the dispersion liquid 34. At this time, the surface of the ionic polymer thin film 24 was negatively charged.

After only the surface of the glass substrate 14, on which the thin film 24 had been formed, was immersed in the dispersion liquid 34, as shown in FIG. 5C, the thin film 24 was irradiated with laser interference light 54 having a wavelength of 500 nm from the back side of the glass substrate 14 for 20 minutes. As a result, the silica particles 44 contained in the dispersion liquid 34 were attached to the surface of the thin film 24 in accordance with the interference pattern of the laser interference light 54.

Figure 5D:
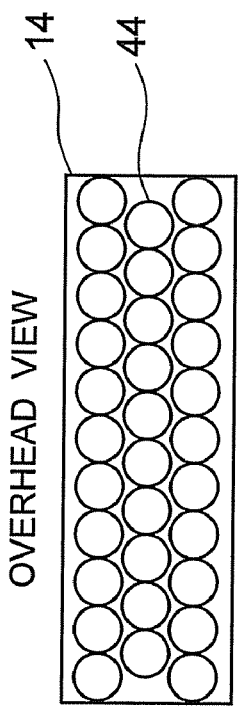

Then, the glass substrate 14 was pulled up from the dispersion liquid 34 and dried. As a result, it was found that, as shown in FIG. 5D, the silica particles 44 were attached to an area irradiated with the laser interference light 54, and arranged in a triangular lattice to form a monolayer.

As described above, in the fourth embodiment of the present invention, metal fine particles contained in the ionic polymer thin film 24 were gold fine particles instead of silver fine particles. The degree of electric field enhancement when the gold fine particles were used was smaller than that when the silver fine particles were used. However, by extending the time for irradiation with the laser interference light 54 from 10 minutes to 20 minutes, it was possible to arrange the silica particles 44 in a triangular lattice to form a monolayer as in the case of the first embodiment.

FIGS. 6A to 6D are schematic diagrams for explaining the outline of the method for arranging particles according to a fifth embodiment of the present invention.

Figure 6C:
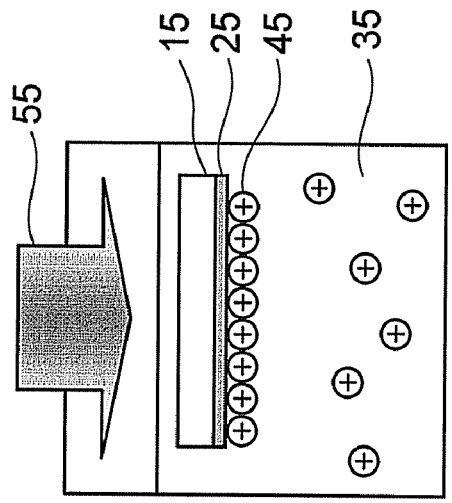
FIGS. 6A to 6D are schematic diagrams for explaining the outline of a fifth embodiment of the present invention.
Figure 6B:
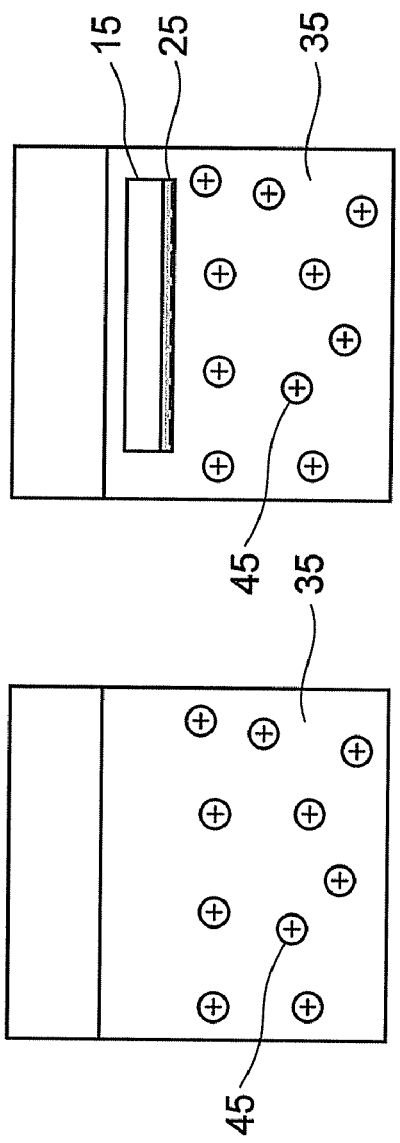
Figure 6A:
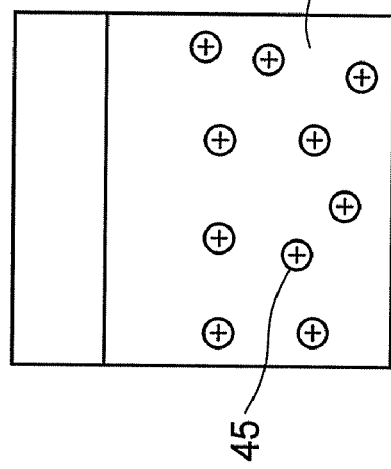

As shown in FIG. 6A, in the fifth embodiment of the present invention, silica particles 45 having a diameter of 500 nm were dispersed in water, as a dispersion liquid 35, having a pH of 4 so that the concentration of the silica particles 45 was 1 wt %. In the dispersion liquid 35, the silica particles 45 were weakly positively charged.

On the surface of a glass substrate 15 used as a transparent substrate, a 100 nm thickness ionic polymer thin film 21 containing silver fine particles having a diameter of 5 nm was formed.

Then, as shown in FIG. 6B, the glass substrate 15 was entirely immersed to an appropriate depth in the dispersion liquid 35, with the front side of the glass substrate 15, on which the ionic polymer thin film 25 had been formed, facing down. At this time, the surface of the ionic polymer thin film 25 was negatively charged.

After the glass substrate 15 was entirely immersed in the dispersion liquid 35, as shown in FIG. 6C, the thin film 25 was irradiated with laser interference light 55 having a wavelength of 500 nm from the back side of the glass substrate 15 through the dispersion liquid 35 positioned on the glass substrate 15 for 15 minutes. As a result, the silica particles 45 contained in the dispersion liquid 35 were attached to the surface of the thin film 25 in accordance with the interference pattern of the laser interference light 55.

Figure 6D:
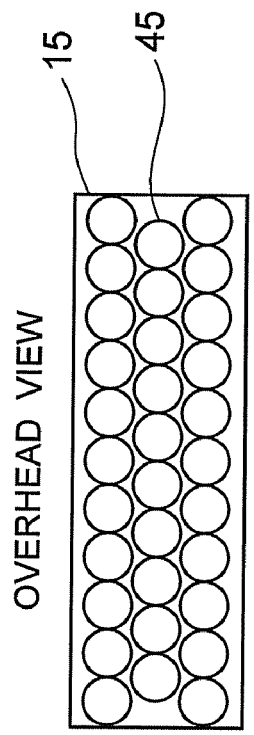

Then, the glass substrate 15 was pulled up from the dispersion liquid 35 and dried. As a result, it was found that, as shown in FIG. 6D, the silica particles 45 were attached to an area irradiated with the laser interference light 55, and arranged in a triangular lattice to form a monolayer.

FIGS. 7A to 7D are schematic diagrams for explaining the outline of the method for arranging particles according to a sixth embodiment of the present invention.

As shown in FIG. 7A, in the sixth embodiment of the present invention, silica particles 46 having a diameter of 480 nm were dispersed in water, as a dispersion liquid 36, having a pH of 4 so that the concentration of the silica particles 46 was 1 wt %. In the dispersion liquid 36, the silica particles 46 were weakly positively charged.

On the surface of a glass substrate 16 used as a transparent substrate, a 100 nm thickness ionic polymer thin film 26 containing silver fine particles having a diameter of 5 nm was formed.

Then, as shown in FIG. 7B, the glass substrate 16 was entirely immersed to an appropriate depth in the dispersion liquid 36, with the front side of the glass substrate 16, on which the ionic polymer thin film 26 had been formed, facing down. At this time, the surface of the ionic polymer thin film 26 was negatively charged.

After the glass substrate 16 was entirely immersed in the dispersion liquid 36, as shown in FIG. 7C, the thin film 26 was irradiated with laser interference light 56 having a wavelength of 500 nm from the front side of the glass substrate 16 through the dispersion liquid 36 positioned below the glass substrate 16 for 15 minutes. As a result, the silica particles 46 contained in the dispersion liquid 36 were attached to the surface of the thin film 26 in accordance with the interference pattern of the laser interference light 56.

Then, the glass substrate 16 was pulled up from the dispersion liquid 36 and dried. As a result, it was found that, as shown in FIG. 7D, the silica particles 46 were attached to an area irradiated with the laser interference light 56, and arranged in a square lattice to form a monolayer.

That is, in the sixth embodiment of the present invention, it was found that also in a case where the ionic polymer thin film 26 was irradiated with the laser interference light 56 from the front side of the glass substrate 16, on which the ionic polymer thin film 26 had been formed, it was possible to regularly arrange the silica particles 46 in a monolayer.

In this regard, it should be noted that since the thin film 26 is irradiated with the laser interference light 56 through the dispersion liquid 36.

Therefore, in the sixth embodiment of the present invention, it was possible to arrange the silica particles 46 having a diameter of 480 nm, which was smaller than that of the silica particles used in the first embodiment, in a square lattice to form a monolayer.

It should be noted that in the sixth embodiment of the present invention, the glass substrate 16 may be opaque because the thin film 26 is irradiated with the laser interference light 56 from the front side of the glass substrate 16.

FIGS. 8A to 8D are schematic diagrams for explaining the outline of the method for arranging particles according to a seventh embodiment of the present invention. It should be noted that the method for arranging particles according to the seventh embodiment of the present invention is used for a method for manufacturing a light-emitting device according to one embodiment of the present invention shown in FIGS. 8A to 8E.

As shown in FIG. 8A, in the seventh embodiment of the present invention, silica particles 47 having a diameter of 500 nm were dispersed in water, as a dispersion liquid 37, having a pH of 4 so that the concentration of the silica particles 47 was 1 wt %. In the dispersion liquid 37, the silica particles 47 were weakly positively charged.

On the surface of a glass substrate 17 used as a transparent substrate, an aluminum film 67, as a reflector, having a thickness of 500 nm was formed by sputtering. Further, on the surface of the aluminum film 67, a 50 nm thickness ionic polymer thin film 27 containing silver fine particles having a diameter of 5 nm was formed.

Then, as shown in FIG. 8B, the glass substrate 17 was entirely immersed to an appropriate depth in the dispersion liquid 37, with the front side of the glass substrate 17, on which the aluminum film 67 and the ionic polymer thin film 27 had been formed, facing down. At this time, the surface of the ionic polymer thin film 27 was negatively charged.

After the glass substrate 17 was entirely immersed in the dispersion liquid 37, as shown in FIG. 8C, the thin film 67 was irradiated with laser interference light 57 having a wavelength of 500 nm from the front side of the glass substrate 17 through the dispersion liquid 37 positioned below the glass substrate 17 for 15 minutes. As a result, the silica particles 47 contained in the dispersion liquid 37 were attached to the surface of the thin film 27 in accordance with the interference pattern of the laser interference light 57.

Then, the glass substrate 17 was pulled up from the dispersion liquid 37 and dried. As a result, it was found that, as shown in FIG. 8D, the silica particles 47 were attached to an area irradiated with the laser interference light 57, and arranged in a square lattice to form a monolayer.

It should be noted that also in the seventh embodiment of the present invention, as in the case of the sixth embodiment, since the thin film 27 is irradiated with the laser interference light 57 from the front side of the glass substrate 17, it is not necessary to allow irradiation light emitted from the back side of the glass substrate 17 to pass through the glass substrate 17. Therefore, it is possible to form the aluminum film 67 between the glass substrate 17 and the thin film 27. The glass substrate 17 may be opaque.

Then, a 150 nm thickness ITO layer 77 as an anode or a positive electrode was deposited by sputtering on a silica particle layer formed of the monolayer of the silica particles 47 arranged in a square lattice.

On the ITO layer 77, a layer 87 composed of N,N'-diphenyl-N,N'-bis(3-methylphenyl)-1,1'-biphenyl-4,4'-diamine (abbreviated as "TPD") was then formed as a hole-injection layer by vapor deposition so as to have a thickness of 50 nm.

On the TPD layer 87, a layer 97 composed of tris-(8-hydroxyquinoline) aluminum (abbreviated as "Alq3") was then formed as a light-emitting layer by vapor deposition so as to have a thickness of 100 nm.

Finally, on the Alq3 layer 97, an ITO layer 107 having a thickness of 150 nm was deposited by sputtering to form a cathode or a negative electrode. In this way, an organic EL (electroluminescence) device shown in FIG. 8E was manufactured.

Furthermore, this light-emitting device is a top emission-type organic EL device, and the peak wavelength thereof is 530 nm. The organic EL device emits light toward the upper side in FIG. 8E. That is, the silica particle layer is provided on the opposite side of the direction of light emission.

The performance of this organic EL device was evaluated, and as a result, it was found that the luminance of the organic EL device was improved 1.5 times than that of a conventional organic EL device not having the silica particle layer 47. It can be considered that such improved luminance is achieved by the release of part of waveguided light from the organic layer toward the outside due to a diffraction effect produced by the silica particle layer 47.

What is claimed is:

1. A method for arranging particles comprising:
    forming a thin film on a surface of a substrate, the thin film being obtained by dispersing first particles made of metal in a material, and a surface of the material being charged to a first polarity when the material is immersed in a predetermined solution;
    dispersing second particles in the predetermined solution, the second particles being charged to a second polarity opposite to the first polarity;
    immersing the thin film in the predetermined solution; and
    irradiating the thin film immersed in the predetermined solution with light having a wavelength which causes plasmon resonance with surface plasmons of the first particles, thereby regularly arranging the second particles in a monolayer on the thin film, the light being laser interference light and being striped interference pattern of laser light comprising a plurality of parallel laser lines.

2. The method according to claim 1, wherein a diameter of the second particles is equal to the wavelength of the light.

3. The method according to claim 1, wherein a diameter of the second particles is smaller than the wavelength of the light.

4. The method according to claim 1, wherein the first particles are made of silver.

5. The method according to claim 1, wherein the first particles are made of gold.

6. The method according to claim 1, wherein a diameter of the first particles is 10 nm or less.

7. The method according to claim 1, wherein the substrate is a transparent substrate, the thin film being irradiated with the light from a back side of the substrate which is an opposite side of a front side of the substrate, the front side of the substrate being a side of the substrate where the thin film is formed.

8. The method according to claim 1, wherein the thin film is irradiated with the light from a front side of the substrate where the thin film is formed.

9. The method according to claim 1, wherein the light is pattern light having an irradiation pattern corresponding to an intended particle arrangement pattern.

10. The method according to claim 1, wherein the material of the thin film is a polymer which is insoluble in the predetermined solution and which has an ionic modifying group as a terminal group.

11. The method according to claim 10, wherein the material of the thin film is carboxylic acid.

12. The method according to claim 10, wherein the material of the thin film is a polymer having an amino group as a terminal group.

13. The method according to claim 1, further comprising drying the thin film and the substrate.

* * * * *